(12) United States Patent
Shen et al.

(10) Patent No.: US 6,254,760 B1
(45) Date of Patent: Jul. 3, 2001

(54) ELECTRO-CHEMICAL DEPOSITION SYSTEM AND METHOD

(75) Inventors: Ben Shen, San Jose; Yezdi Dordi, Palo Alto; George Birkmaier, Cupertino, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/263,649

(22) Filed: Mar. 5, 1999

(51) Int. Cl.$^7$ .............................. G01F 1/64; G01N 17/00; C25B 15/00; C25D 17/00; C25D 21/12
(52) U.S. Cl. ...................... 205/335; 205/775; 205/788.5; 204/198; 204/232; 204/240
(58) Field of Search ..................................... 204/232, 240, 204/198; 205/335, 775, 788.5, 788

(56) References Cited

U.S. PATENT DOCUMENTS

| | | | |
|---|---|---|---|
| 3,649,509 | * 3/1972 | Morawetz et al. | 204/238 |
| 3,727,620 | 4/1973 | Orr | 134/95 |
| 3,770,598 | 11/1973 | Creutz | 204/52 R |
| 4,027,686 | 6/1977 | Shortes et al. | 134/33 |
| 4,045,304 | * 8/1977 | Tezuka | 205/81 |

(List continued on next page.)

FOREIGN PATENT DOCUMENTS

| | | | |
|---|---|---|---|
| 58-182823 | 10/1983 | (JP) | H01L/21/288 |
| 63-118093 | 5/1988 | (JP) | C25D/5/18 |
| 04131395 | 5/1992 | (JP) | C25D/5/34 |
| 04280993 | 10/1992 | (JP) | C25D/5/18 |
| 6017291 | 1/1994 | (JP) | C25D/7/12 |
| WO 97/12079 | 4/1997 | (WO) | C25D/5/02 |

OTHER PUBLICATIONS

PCT Written Opinion citing additional references for PCT/US 99/28159, dated Dec. 8, 2000.
Lucio Colombo, "Wafer Back Surface Film Removal," Central R&D, SGS–Thompson, Microelectronics, Agrate, Italy, 6 pages, No date.
Semitool©, Inc., "Metallization & Interconnect," 1998, 4 pages, No month.
Verteq Online©, "Products Overview," 1996–1998, 5 pages, No month.

(List continued on next page.)

Primary Examiner—Donald R. Valentine
(74) Attorney, Agent, or Firm—Thomason, Moser & Patterson, L.L.P.

(57) ABSTRACT

The present invention generally provides an electro-chemical deposition system that is designed with a flexible architecture that is expandable to accommodate future designs rules and gap fill requirements and provides satisfactory throughput to meet the demands of other processing systems. The electro-chemical deposition system generally comprises a front-end loading station, a mainframe including one or more processing cells, and an electrolyte replenishing system fluidly connected to the one or more electrical processing cells. The electrolyte replenishing system comprises a main electrolyte supply tank and an analyzer module and dosing module coupled thereto. The analyzer module includes one or more chemical analyzers to monitor the concentrations of various chemicals in the main electrolyte supply tank. Information provided by the analyzer module is transmitted via a central control system to the dosing module. Source tanks in the dosing module communicate with the main supply tank to deliver the desired proportions of chemicals thereto. Preferably, the electrolyte analysis is performed continuously during processing to provide real-time data and electrolyte adjustments.

14 Claims, 13 Drawing Sheets

U.S. PATENT DOCUMENTS

| | | | |
|---|---|---|---|
| 4,092,176 | 5/1978 | Kozai et al. | 134/186 |
| 4,110,176 | 8/1978 | Creutz et al. | 204/52 R |
| 4,113,492 | 9/1978 | Sato et al. | 96/67 |
| 4,315,059 | 2/1982 | Raistrick et al. | 429/112 |
| 4,326,940 * | 4/1982 | Eckles et al. | 204/232 |
| 4,336,114 | 6/1982 | Mayer et al. | 204/52 R |
| 4,376,685 | 3/1983 | Watson | 204/52 R |
| 4,405,416 | 9/1983 | Raistrick et al. | 204/68 |
| 4,428,815 | 1/1984 | Powell et al. | 204/297 W |
| 4,435,266 | 3/1984 | Johnston | 204/276 |
| 4,489,740 | 12/1984 | Rattan et al. | 134/140 |
| 4,510,176 | 4/1985 | Cuthbert et al. | 427/82 |
| 4,518,678 | 5/1985 | Allen | 430/311 |
| 4,519,846 | 5/1985 | Aigo | 134/15 |
| 4,693,805 | 9/1987 | Quazi | 204/192.22 |
| 4,732,785 | 3/1988 | Brewer | 427/240 |
| 4,789,445 * | 12/1988 | Goffman | 205/335 |
| 5,039,381 | 8/1991 | Mullarkey | 204/47.5 |
| 5,055,425 | 10/1991 | Leibovitz et al. | 437/195 |
| 5,092,975 | 3/1992 | Yamamura et al. | 204/198 |
| 5,155,336 | 10/1992 | Gronet et al. | 219/411 |
| 5,162,260 | 11/1992 | Leibovitz et al. | 437/195 |
| 5,222,310 | 6/1993 | Thompson et al. | 34/202 |
| 5,224,504 | 7/1993 | Thompson et al. | 134/155 |
| 5,230,743 | 7/1993 | Thompson et al. | 134/32 |
| 5,252,807 | 10/1993 | Chizinsky | 219/390 |
| 5,256,274 | 10/1993 | Poris | 205/123 |
| 5,259,407 | 11/1993 | Tuchida et al. | 134/151 |
| 5,290,361 | 3/1994 | Hayashida et al. | 134/2 |
| 5,316,974 | 5/1994 | Crank | 437/190 |
| 5,328,589 | 7/1994 | Martin | 205/296 |
| 5,349,978 | 9/1994 | Sago et al. | 134/153 |
| 5,368,711 | 11/1994 | Poris | 204/193 |
| 5,368,715 * | 11/1994 | Hurley et al. | 204/232 X |
| 5,377,708 | 1/1995 | Bergman et al. | 134/105 |
| 5,429,733 | 7/1995 | Ishida | 204/224 R |
| 5,447,615 | 9/1995 | Ishida | 204/224 R |
| 5,516,412 | 5/1996 | Andricacos et al. | 204/224 R |
| 5,608,943 | 3/1997 | Konishi et al. | 15/302 |
| 5,625,170 | 4/1997 | Poris | 177/50 |
| 5,651,865 | 7/1997 | Sellers | 204/192.13 |
| 5,705,223 | 1/1998 | Bunkofske | 427/240 |
| 5,718,813 | 2/1998 | Drummond et al. | 204/192.12 |
| 5,723,028 | 3/1998 | Poris | 204/231 |

OTHER PUBLICATIONS

Laurell Technologies Corporation, "Two control configurations available–see *WS 400 OR WS–400Lite*." Oct. 19, 1998, 6 pages.

Peter Singer, "Tantalum, Copper and Damascene: The Future of Interconnects," Semiconductor International, Jun., 1998, Pages cover, 91–92,94,96 & 98.

Peter Singer, "Wafer Processing," Semiconductor International, Jun., 1998, p. 70.

PCT International Search Report dated Feb. 7, 2000.

Kenneth E. Pitney, "NEY Contact Manual," Electrical Contacts for Low Energy Uses, 1973 (No month).

* cited by examiner

ELECTRO-CHEMICAL DEPOSITION SYSTEM AND METHOD

BACKGROUND OF THE INVENTION

1. Field of the Invention

The present invention generally relates to deposition of a metal layer onto a wafer/substrate. More particularly, the present invention relates to an electrochemical deposition system or electroplating system for forming a metal layer on a wafer/substrate having an integrated electrolyte analyzing module.

2. Background of the Related Art

Sub-quarter micron, multi-level metallization is one of the key technologies for the next generation of ultra large scale integration (ULSI). The multilevel interconnects that lie at the heart of this technology require planarization of interconnect features formed in high aspect ratio apertures, including contacts, vias, lines and other features. Reliable formation of these interconnect features is very important to the success of ULSI and to the continued effort to increase circuit density and quality on individual substrates and die.

As circuit densities increase, the widths of vias, contacts and other features, as well as the dielectric materials between them, decrease to less than 250 nanometers, whereas the thickness of the dielectric layers remains substantially constant, with the result that the aspect ratios for the features, i.e., their height divided by width, increases. Many traditional deposition processes, such as physical vapor deposition (PVD) and chemical vapor deposition (CVD), have difficulty filling structures where the aspect ratio exceed 4:1, and particularly where it exceeds 10:1. Therefore, there is a great amount of ongoing effort being directed at the formation of void-free, nanometer-sized features having high aspect ratios wherein the ratio of feature height to feature width can be 4:1 or higher. Additionally, as the feature widths decrease, the device current remains constant or increases, which results in an increased current density in the feature.

Elemental aluminum (Al) and its alloys have been the traditional metals used to form lines and plugs in semiconductor processing because of aluminum's perceived low electrical resistivity, its superior adhesion to silicon dioxide ($SiO_2$), its ease of patterning, and the ability to obtain it in a highly pure form. However, aluminum has a higher electrical resistivity than other more conductive metals such as copper, and aluminum also can suffer from electromigration leading to the formation of voids in the conductor.

Copper and its alloys have lower resistivities than aluminum and significantly higher electromigration resistance as compared to aluminum. These characteristics are important for supporting the higher current densities experienced at high levels of integration and increase device speed. Copper also has good thermal conductivity and is available in a highly pure state. Therefore, copper is becoming a choice metal for filling sub-quarter micron, high aspect ratio interconnect features on semiconductor substrates.

Despite the desirability of using copper for semiconductor device fabrication, choices of fabrication methods for depositing copper into very high aspect ratio features, such as a 4:1, having 0.35µ (or less) wide vias are limited. As a result of these process limitations, plating, which had previously been limited to the fabrication of lines on circuit boards, is just now being used to fill vias and contacts on semiconductor devices.

Metal electroplating is generally known and can be achieved by a variety of techniques. A typical method generally comprises physical vapor depositing a barrier layer over the feature surfaces, physical vapor depositing a conductive metal seed layer, preferably copper, over the barrier layer, and then electroplating a conductive metal over the seed layer to fill the structure/feature. Finally, the deposited layers and the dielectric layers are planarized, such as by chemical mechanical polishing (CMP), to define a conductive interconnect feature.

FIG. 1 is a cross sectional view of a simplified typical fountain plater 10 incorporating contact pins. Generally, the fountain plater 10 includes an electrolyte container 12 having a top opening, a substrate holder 14 disposed above the electrolyte container 12, an anode 16 disposed at a bottom portion of the electrolyte container 12 and a contact ring 20 contacting the substrate 22. A plurality of grooves 24 are formed in the lower surface of the substrate holder 14. A vacuum pump (not shown) is coupled to the substrate holder 14 and communicates with the grooves 24 to create a vacuum condition capable of securing the substrate 22 to the substrate holder 14 during processing. The contact ring 20 comprises a plurality of metallic or semi-metallic contact pins 26 distributed about the peripheral portion of the substrate 22 to define a central substrate plating surface. The plurality of contact pins 26 extend radially inwardly over a narrow perimeter portion of the substrate 22 and contact a conductive seed layer of the substrate 22 at the tips of the contact pins 26. A power supply (not shown) is attached to the pins 26 thereby providing an electrical bias to the substrate 22. The substrate 22 is positioned above the cylindrical electrolyte container 12 and electrolyte flow impinges perpendicularly on the substrate plating surface during operation of the cell 10.

While present day electroplating cells, such as the one shown in FIG. 1, achieve acceptable results on larger scale substrates, a number of obstacles impair consistent reliable electroplating onto substrates having micron-sized, high aspect ratio features. Generally, these obstacles include providing uniform power distribution and current density across the substrate plating surface to form a metal layer having uniform thickness, preventing unwanted edge and backside deposition to control contamination to the substrate being processed as well as subsequent substrates, and maintaining a vacuum condition which secures the substrate to the substrate holder during processing. Also, the present day electroplating cells have not provided satisfactory throughput to meet the demands of other processing systems and are not designed with a flexible architecture that is expandable to accommodate future designs rules and gap fill requirements.

Additionally, current electroplating systems are incapable of performing necessary processing steps without resorting to peripheral components and time intensive efforts. For example, analysis of the processing chemicals is required periodically during the plating process. The analysis determines the composition of the electrolyte to ensure proper proportions of the ingredients. Conventional analysis is performed by extracting a sample of electrolyte from a test port and transferring the sample to a remote analyzer. The electrolyte composition is then manually adjusted according to the results of the analysis. The analysis must be performed frequently because the concentrations of the various chemicals are in constant flux. However, the foregoing method is time consuming and limits the number of analyses which can be performed.

Therefore, there remains a need for an electrochemical deposition system that is designed with a flexible architecture that is expandable to accommodate future designs rules and gap fill requirements and provides satisfactory throughput to meet the demands of other processing systems. There is also a need for an electrochemical deposition system that provides uniform power distribution and current density across the substrate plating surface to form a metal layer having uniform thickness and maintain a vacuum condition which secures the substrate to the substrate holder during processing. It would be desirable for the system to prevent and/or remove unwanted edge and backside deposition to control contamination to the substrate being processed as well as subsequent substrates. It would also be desirable for the system to include one or more chemical analyzers integrated with the processing system to provide real-time analysis of the electrolyte composition.

SUMMARY OF THE INVENTION

The present invention generally provides an electrochemical deposition system that is designed with a flexible architecture that is expandable to accommodate future designs rules and gap fill requirements and provides satisfactory throughput to meet the demands of other processing systems. The electrochemical deposition system generally comprises a mainframe having a mainframe wafer transfer robot, a loading station disposed in connection with the mainframe, one or more processing cells disposed in connection with the mainframe, and an electrolyte supply fluidly connected to the one or more electrical processing cells. Preferably, the electrochemical deposition system includes a system controller for controlling an electro-chemical deposition process and related components, a spin-rinse-dry (SRD) station disposed between the loading station and the mainframe, and an electrolyte replenishing system including an integrated chemical analyzer.

One aspect of the invention provides an electrochemical deposition system that provides uniform power distribution and current density across the substrate plating surface to form a metal layer having uniform thickness and maintain a vacuum condition which secures the substrate to the substrate holder during processing.

Another aspect of the invention provides an electrochemical deposition system that prevents and/or remove unwanted edge and backside deposition to control contamination to the substrate being processed as well as subsequent substrates.

Still another aspect of the invention provides a real-time chemical analyzer module. The chemical analyzer module includes at least one and preferably two analyzers operated by a controller and integrated with a control system of the electro-chemical deposition system. A sample line provides continuous flow of electrolyte from a main electrolyte tank to the chemical analyzer module. A first analyzer determines the concentrations of organic substances in the electrolyte while the second analyzer determines the concentrations of inorganic substances.

Another aspect of the invention provides a real-time chemical analyzer module and a dosing module. The chemical analyzer module includes at least one and preferably two analyzers operated by a controller and integrated with a control system of the electrochemical deposition system. A sample line provides continuous flow of electrolyte from a main electrolyte tank to the chemical analyzer module. A first analyzer determines the concentrations of organic substances in the electrolyte while the second analyzer determines the concentrations of inorganic substances. The dosing module is then activated to deliver the proper proportions of chemicals to the main tank in response to the information obtained by the chemical analyzer module.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
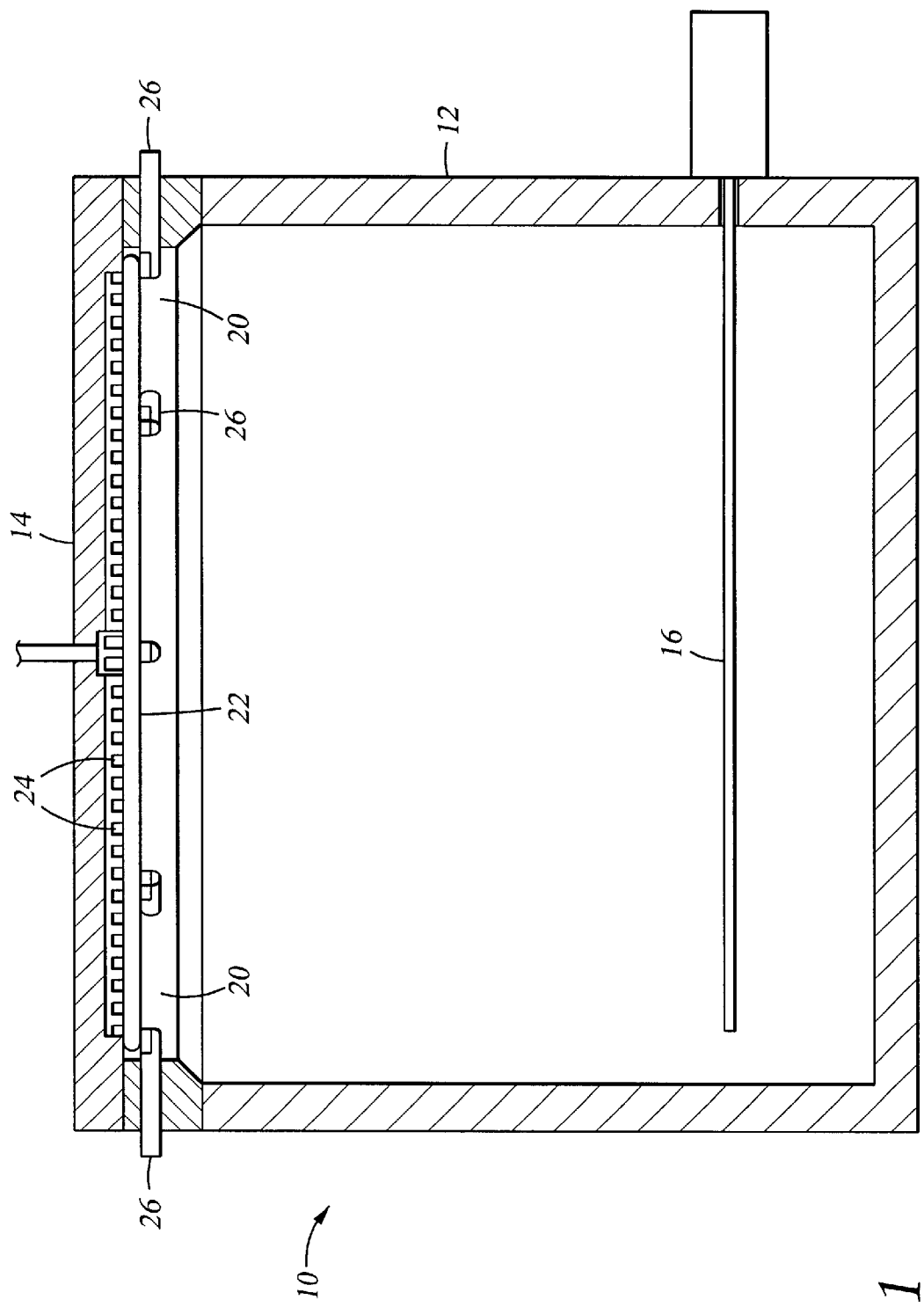
FIG. 1 is a cross sectional view of a simplified typical fountain plater 10 incorporating contact pins.
Figure 2:
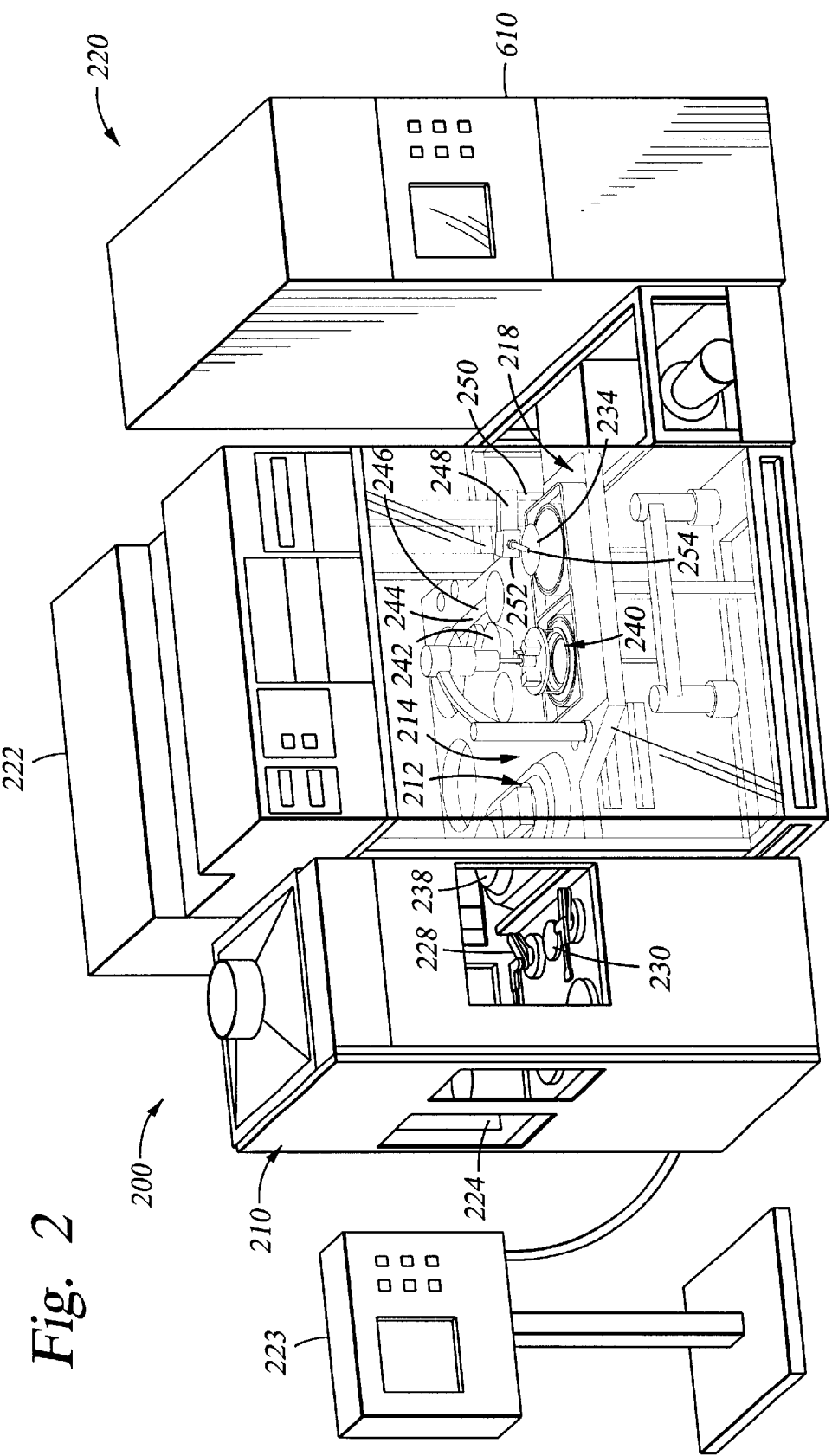
FIG. 2 is a perspective view of an electroplating system platform 200 of the invention.
Figure 3:
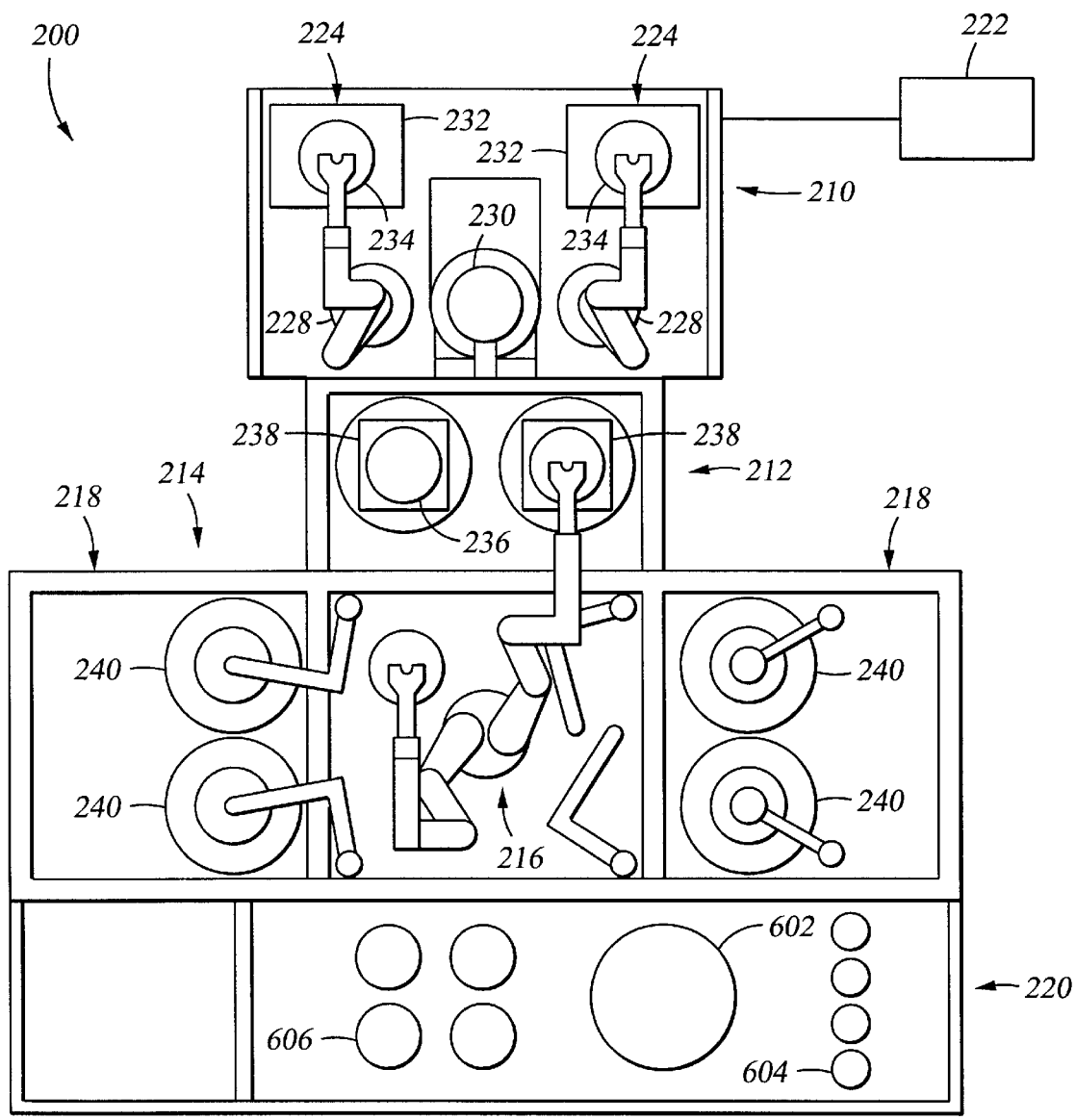
FIG. 3 is a schematic view of an electroplating system platform 200 of the invention.

FIG. 2 is a perspective view of an electroplating system platform 200 of the invention. FIG. 3 is a schematic view of an electroplating system platform 200 of the invention. Referring to both FIGS. 2 and 3, the electroplating system platform 200 generally comprises a loading station 210, a spin-rinse-dry (SRD) station 212, a mainframe 214, and an electrolyte replenishing system 220. Preferably, the electroplating system platform 200 is enclosed in a clean environment using panels such as plexiglass panels. The mainframe 214 generally comprises a mainframe transfer station 216 and a plurality of processing stations 218. Each processing station 218 includes one or more processing cells 240. An electrolyte replenishing system 220 is positioned adjacent the electroplating system platform 200 and connected to the process cells 240 individually to circulate electrolyte used for the electroplating process. The electroplating system platform 200 also includes a control system 222, typically comprising a programmable microprocessor.

The loading station 210 preferably includes one or more wafer cassette receiving areas 224, one or more loading station transfer robots 228 and at least one wafer orientor 230. The number of wafer cassette receiving areas, loading station transfer robots 228 and wafer orientor included in the loading station 210 can be configured according to the desired throughput of the system. As shown for one embodiment in FIGS. 2 and 3, the loading station 210 includes two wafer cassette receiving areas 224, two loading station transfer robots 228 and one wafer orientor 230. A wafer cassette 232 containing wafers 234 is loaded onto the wafer cassette receiving area 224 to introduce wafers 234 into the electroplating system platform. The loading station transfer robot 228 transfers wafers 234 between the wafer cassette 232 and the wafer orientor 230. The loading station transfer robot 228 comprises a typical transfer robot commonly known in the art. The wafer orientor 230 positions each wafer 234 in a desired orientation to ensure that the wafer is properly processed. The loading station transfer robot 228 also transfers wafers 234 between the loading station 210 and the SRD station 212.

Figure 4:
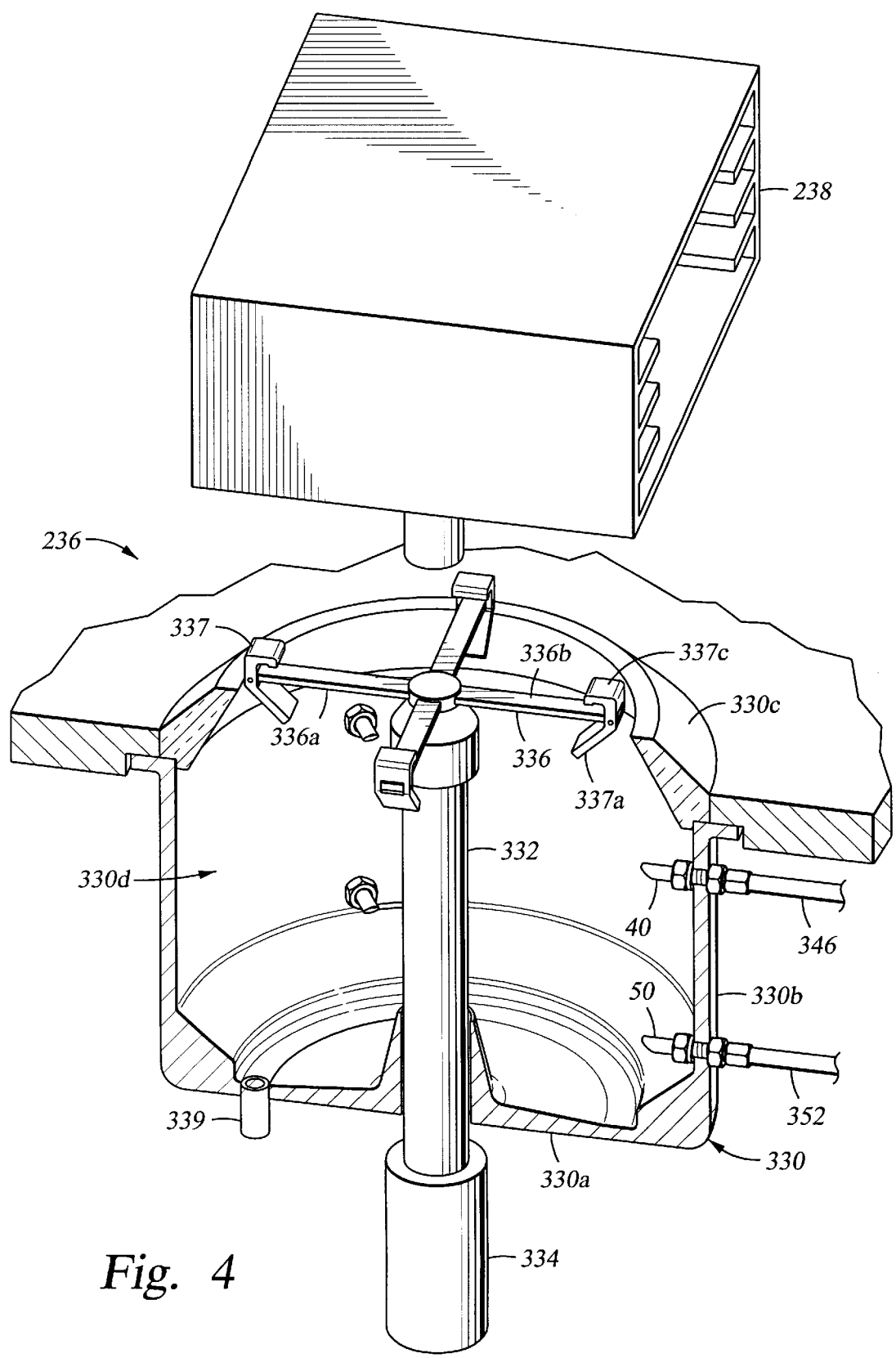
FIG. 4 is a schematic perspective view of a spin-rinse-dry (SRD) module of the present invention, incorporating rinsing and dissolving fluid inlets.
Figure 5:
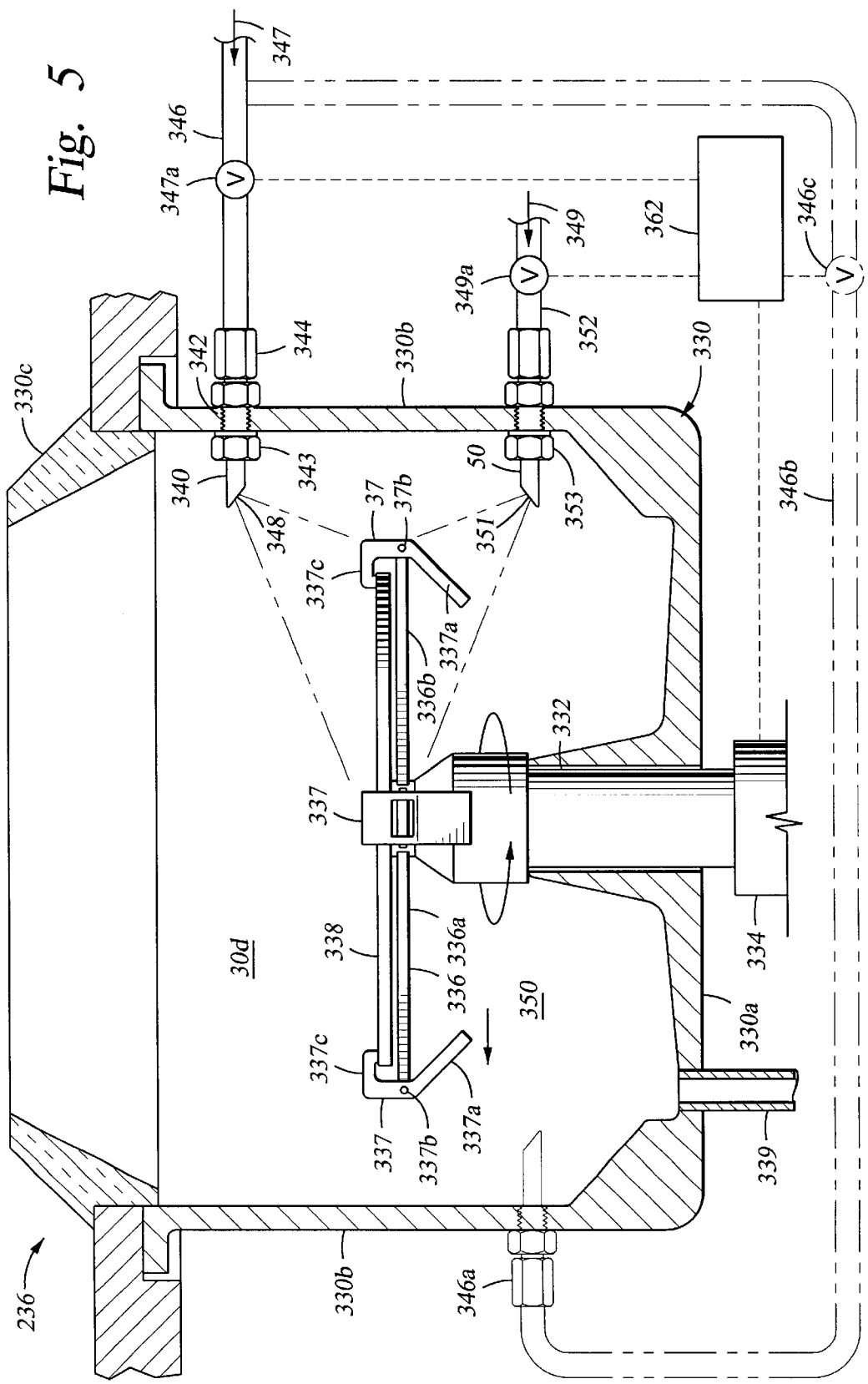
FIG. 5 is a side cross sectional view of the spin-rinse-dry (SRD) module of FIG. 4 and shows a substrate in a processing position vertically disposed between fluid inlets.

FIG. 4 is a schematic perspective view of a spin-rinse-dry (SRD) module of the present invention, incorporating rinsing and dissolving fluid inlets. FIG. 5 is a side cross sectional view of the spin-rinse-dry (SRD) module of FIG. 4 and shows a substrate in a processing position vertically disposed between fluid inlets. Preferably, the SRD station 212 includes one or more SRD modules 236 and one or more wafer pass-through cassettes 238. Preferably, the SRD station 212 includes two SRD modules 236 corresponding to the number of loading station transfer robots 228, and a wafer pass-through cassette 238 is positioned above each SRD module 236. The wafer pass-through cassette 238 facilitates wafer transfer between the loading station 210 and the mainframe 214. The wafer pass-through cassette 238 provides access to and from both the loading station transfer robot 228 and a robot in the mainframe transfer station 216.

Referring to FIGS. 4 and 5, the SRD module 238 comprises a bottom 330a and a sidewall 330b, and an upper shield 330c which collectively define a SRD module bowl 330d, where the shield attaches to the sidewall and assists in retaining the fluids within the SRD module. Alternatively, a removable cover could also be used. A pedestal 336, located in the SRD module, includes a pedestal support 332 and a pedestal actuator 334. The pedestal 336 supports the substrate 338 (shown in FIG. 5) on the pedestal upper surface during processing. The pedestal actuator 334 rotates the pedestal to spin the substrate and raises and lowers the pedestal as described below. The substrate may be held in place on the pedestal by a plurality of lamps 337. The clamps pivot with centrifugal force and engage the substrate preferably in the edge exclusion zone of the substrate. In a preferred embodiment, the clamps engage the substrate only when the substrate lifts off the pedestal during the processing. Vacuum passages (not shown) may also be used as well as other holding elements. The pedestal has a plurality of pedestal arms 336a and 336b, so that the fluid through the second nozzle may impact as much surface area on the lower surface of the substrate as is practical. An outlet 339 allows fluid to be removed from the SRD module. The terms "below", "above", "bottom", "top", "up", "down", "upper", and "lower" and other positional terms used herein are shown with respect to the embodiments in the figures and may be varied depending on the relative orientation of the processing apparatus.

A first conduit 346, through which a first fluid 347 flows, is connected to a valve 347a. The conduit may be hose, pipe, tube, or other fluid containing conduits. The valve 347a controls the flow of the first fluid 347 and may be selected from a variety of valves including a needle, globe, butterfly, or other valve types and may include a valve actuator, such as a solenoid, that can be controlled with a controller 362. The conduit 346 connects to a first fluid inlet 340 that is located above the substrate and includes a mounting portion 342 to attach to the SRD module and a connecting portion 344 to attach to the conduit 346. The first fluid inlet is shown with a single first nozzle 348 to deliver a first fluid 347 under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module at a variety of positions. For instance, if the flow is desired to be a certain angle that is directed back toward the SRD module periphery along the edge of the substrate, the nozzles could be extended radially inward and the discharge from the nozzles be directed back toward the SRD module periphery.

The controller 362 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c, which may be used to flow a rinsing fluid on the backside of the substrate after the dissolving fluid is flown without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot (not shown) places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located. In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm wafer. The invention could also be used to remove the unwanted deposits along the edge of the substrate to create an edge exclusion zone. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process of the present invention described above.

The SRD module 238 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two processing cells 240. The mainframe transfer station 216 includes a mainframe transfer robot 242. Preferably, the mainframe transfer robot 242 comprises a plurality of individual robot arms 244 that provides independent access of wafers in the processing stations 218 and the SRD stations 212. As shown in FIG. 3, the mainframe transfer robot 242 comprises two robot arms 244, corresponding to the number of processing cells 240 per processing station 218. Each robot arm 244 includes a robot blade 246 for holding a wafer during a wafer transfer. Preferably, each robot arm 244 is operable independently of the other arm to facilitate independent transfers of wafers in the system. Alternatively, the robot arms 244 operate in a linked fashion such that one robot extends as the other robot arm retracts.

Preferably, the mainframe transfer station 216 includes a flipper robot 248 that facilitates transfer of a wafer from a face-up position on the robot blade 246 of the mainframe transfer robot 242 to a face down position for a process cell 240 that requires face-down processing of wafers. The flipper robot 248 includes a main body 250 that provides both vertical and rotational movements with respect to a vertical axis of the main body 250 and a flipper robot arm 252 that provides rotational movement along a horizontal axis along the flipper robot arm 252. Preferably, a vacuum suction gripper 254, disposed at the distal end of the flipper robot arm 252, holds the wafer as the wafer is flipped and transferred by the flipper robot 248. The flipper robot 248 positions a wafer 234 into the processing cell 240 for face-down processing. The details of the electroplating processing cell according to the invention will be discussed below.

Figure 6:
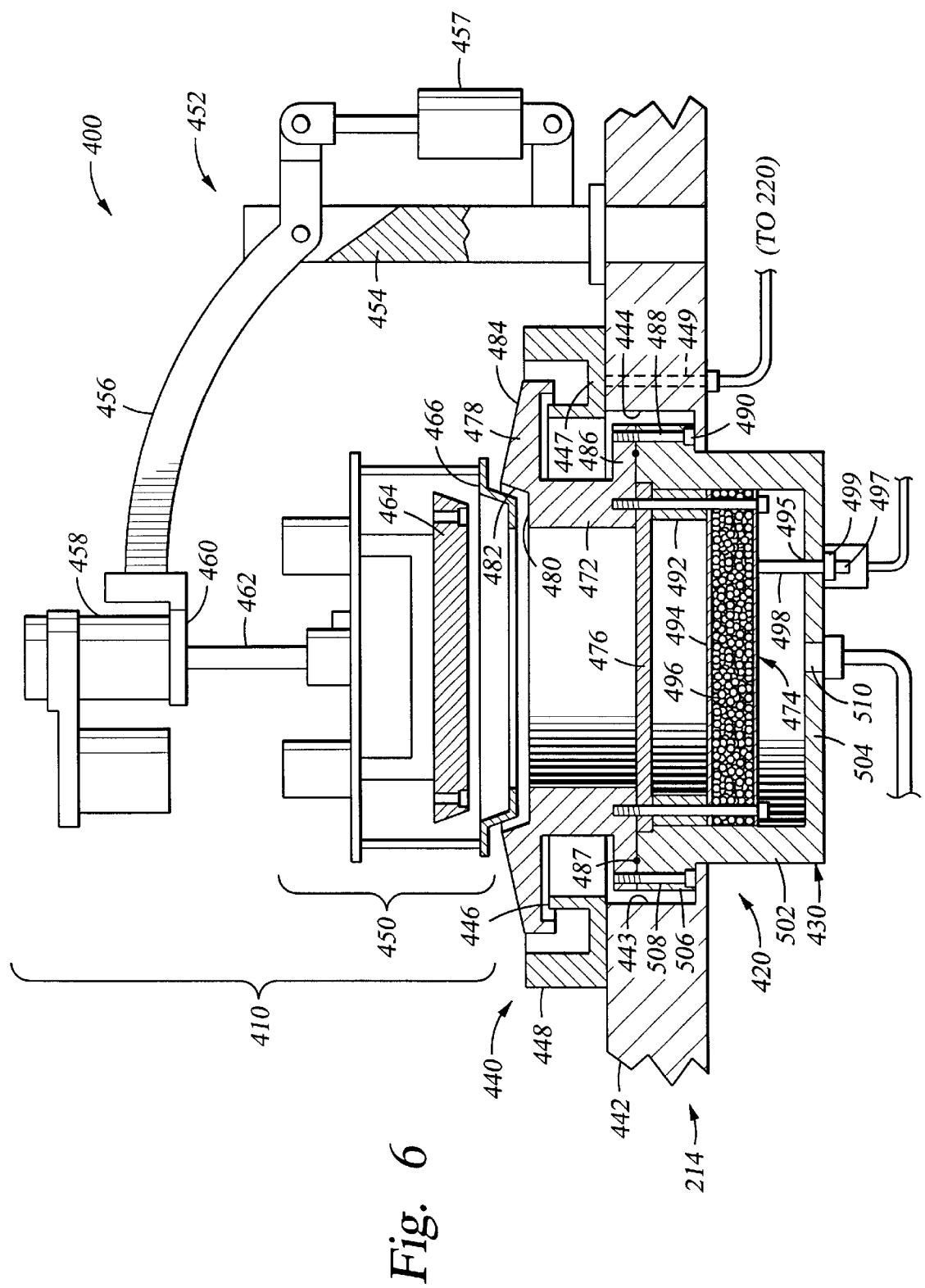
FIG. 6 is a cross sectional view of an electroplating process cell 240 according to the invention.

FIG. 6 is a cross sectional view of an electroplating process cell 240 according to the invention. The processing cell 240 generally comprises a head assembly 410, a process kit 420 and an electrolyte collector 440. Preferably, the electrolyte collector 440 is secured onto the body 442 of the mainframe 214 over an opening 443 that defines the location for placement of the process kit 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220 (shown in FIG. 2) through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process kit 420 to provide the spacing required to remove and/or replace the process kit 420 from the electroplating process cell 240. When the cantilever arm actuator 457 is extended, the cantilever arm 456 moves the head assembly 410 toward the process kit 420 to position the wafer in the head assembly 410 in a processing position.

The head assembly 410 generally comprises a wafer holder assembly 450 and a wafer assembly actuator 458. The wafer assembly actuator 458 is mounted onto the mounting plate 460, and includes a head assembly shaft 462 extending downwardly through the mounting plate 460. The lower end of the head assembly shaft 462 is connected to the wafer holder assembly 450 to position the wafer holder assembly 450 in a processing position and in a wafer loading position.

Figure 7:
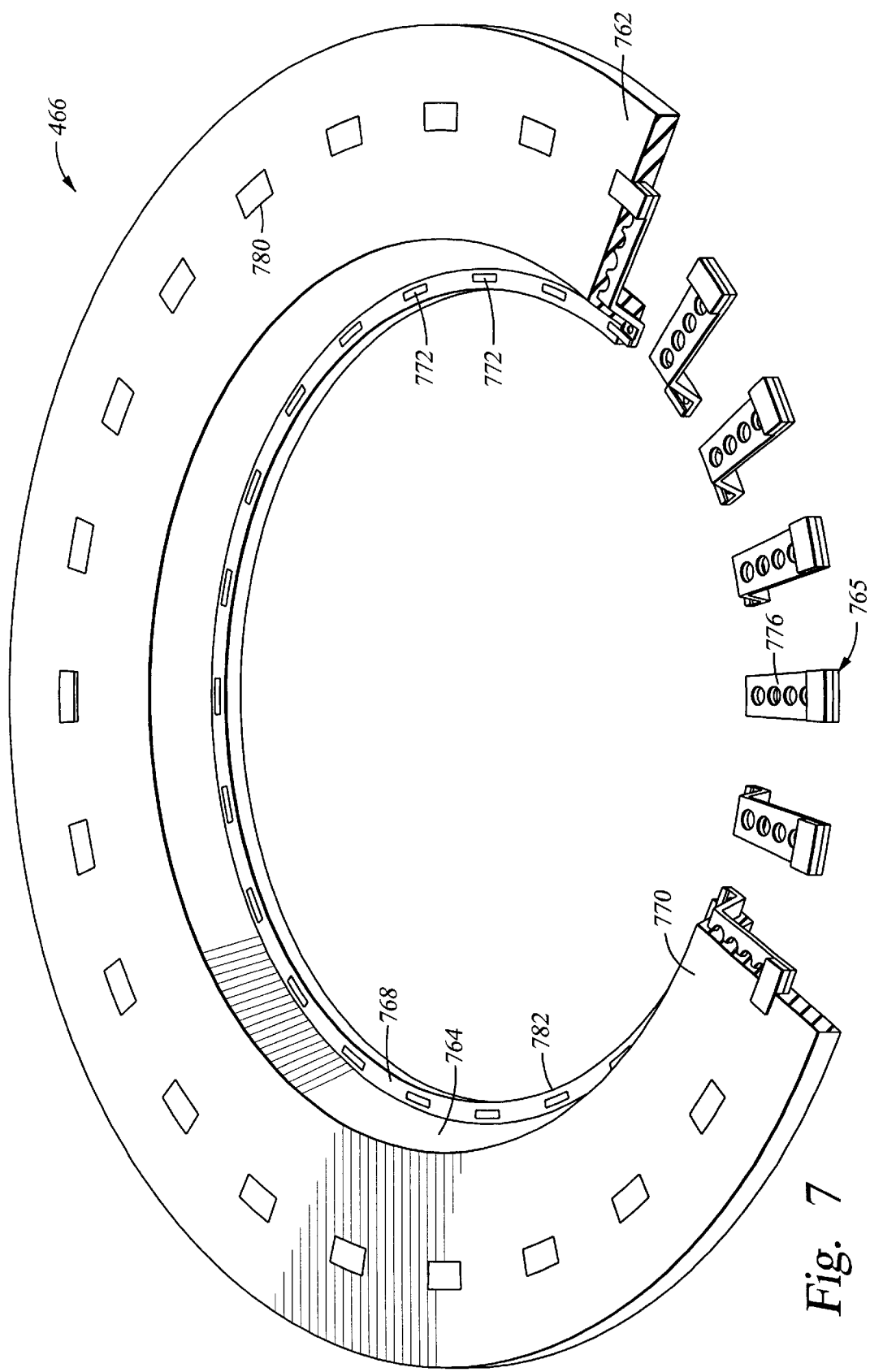
FIG. 7 is a partial cross sectional perspective view of a cathode contact ring.

The wafer holder assembly 450 generally comprises a wafer holder 464 and a cathode contact ring 466. FIG. 7 is a cross sectional view of one embodiment of a cathode contact ring 466 of the present invention. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown having a flange 762 and a downward sloping shoulder portion 764 leading to a substrate seating surface 768 located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electrical contact pads 780 annularly disposed on the flange 762, a plurality of inner electrical contact pads 772 disposed on a portion of the substrate seating surface 768, and a plurality of embedded conducting connectors 776 which link the pads 772, 780 to one another. The conducting members 765 are isolated from one another by the insulative body 770 which may be made of a plastic such as polyvinylidenefluoride (PVDF), perfluoroalkoxy resin (PFA), Teflon™, and Tefzel™, or any other insulating material such as Alumina ($Al_2O_3$) or other ceramics. The outer contact pads 780 are coupled to a power supply (not shown) to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper (resistivity for copper is approximately $2 \times 10^{-8}$ $\Omega \cdot m$) and be coated with platinum (resistivity for platinum is approximately $10.6 \times 10^{-8}$ $\Omega \cdot m$). Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation which acts as an insulator, the inner contact pads 772 preferably comprise a material resistant to oxidation such as Pt, Ag, or Au.

Figures 8, 9:
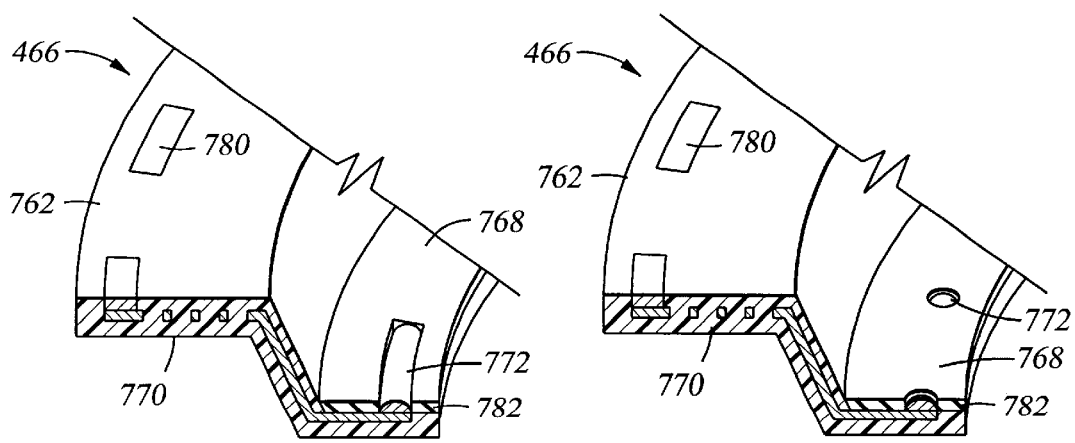
FIG. 8 is a cross sectional perspective view of the cathode contact ring showing an alternative embodiment of contact pads.
FIG. 9 is a cross sectional perspective view of the cathode contact ring showing an alternative embodiment of the contact pads and an isolation gasket.

In addition to being a function of the contact material, the total resistance of each circuit is dependent on the geometry, or shape, of the inner contact inner contact pads 772 and the force supplied by the contact ring 466. These factors define a constriction resistance, $R_{CR}$, at the interface of the inner contact pads 772 and the substrate seating surface 768 due to asperities between the two surfaces. Generally, as the applied force is increased the apparent area is also increased. The apparent area is, in turn, inversely related to $R_{CR}$ so that an increase in the apparent area results in a decreased $R_{CR}$. Thus, to minimize overall resistance it is preferable to maximize force. The maximum force applied in operation is limited by the yield strength of a substrate which may be damaged under excessive force and resulting pressure. However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes which may be used to advantage. A more complete discussion of the relation between contact geometry, force, and resistance is given in Ney Contact Manual, by Kenneth E. Pitney, The J. M. Ney Company, 1973, which is hereby incorporated by reference in its entirety.

The number of connectors 776 may be varied depending on the particular number of contact pads 772 (shown in FIG. 7) desired. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions of the present invention are readily altered to suit a particular application (for example, a 300 mm substrate), the optimal number may easily be determined for varying scales and embodiments.

Figure 10:
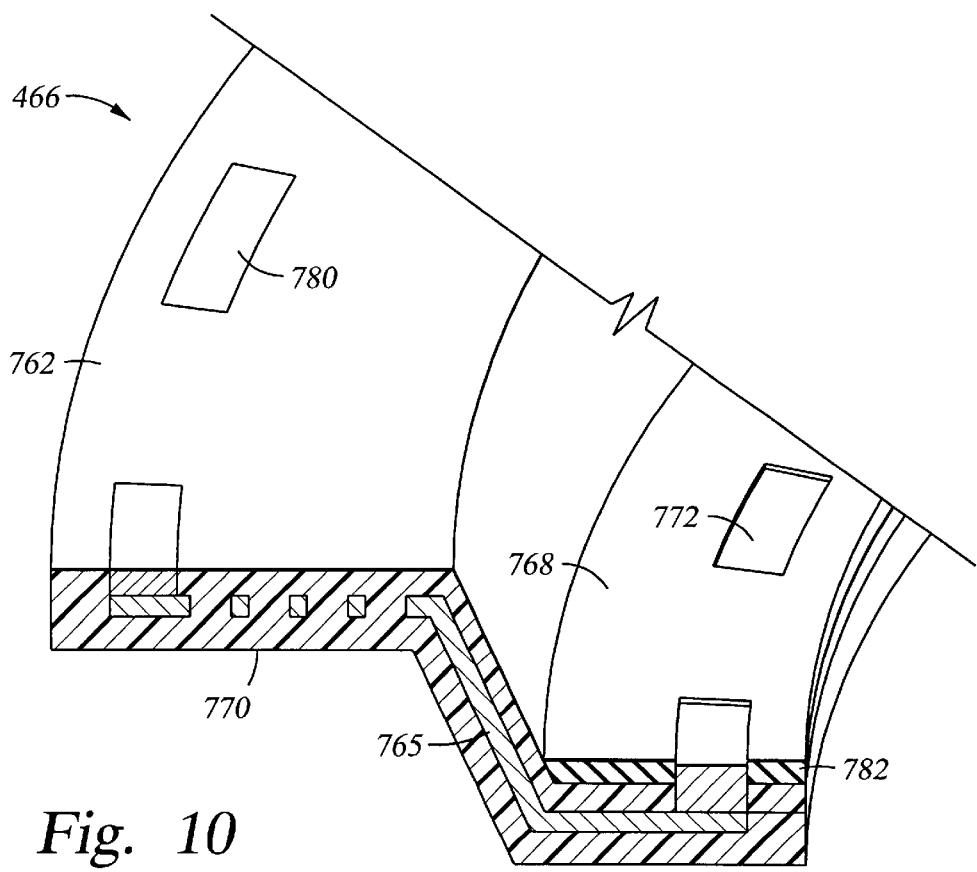
FIG. 10 is a cross sectional perspective view of the cathode contact ring showing the isolation gasket.

As shown in FIG. 10, the substrate seating surface 768 comprises an isolation gasket 782 disposed on the insulative body 770 and extending diametrically interior to the inner contact pads 772 to define the inner diameter of the contact ring 466. The isolation gasket 782 preferably extends slightly above the inner contact pads 772 (e.g., a few mils) and preferably comprises an elastomer such as Viton™, Teflon™, buna rubber and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 which may be advantageous where material costs are significant such as when the inner contact pads 772 comprise gold. Persons skilled in the art will recognize other embodiments which do not depart from the scope of the present invention.

During processing, the isolation gasket 782 maintains contact with a peripheral portion of the substrate plating surface and is compressed to provide a seal between the remaining cathode contact ring 466 and the substrate. The seal prevents the electrolyte from contacting the edge and backside of the substrate. As noted above, maintaining a clean contact surface is necessary to achieving high plating repeatability. Previous contact ring designs did not provide consist plating results because contact surface topography varied over time. The contact ring of the present invention eliminates, or least minimizes, deposits which would otherwise accumulate on the inner contact pads 772 and change their characteristics thereby producing highly repeatable, consistent, and uniform plating across the substrate plating surface.

Figure 11:
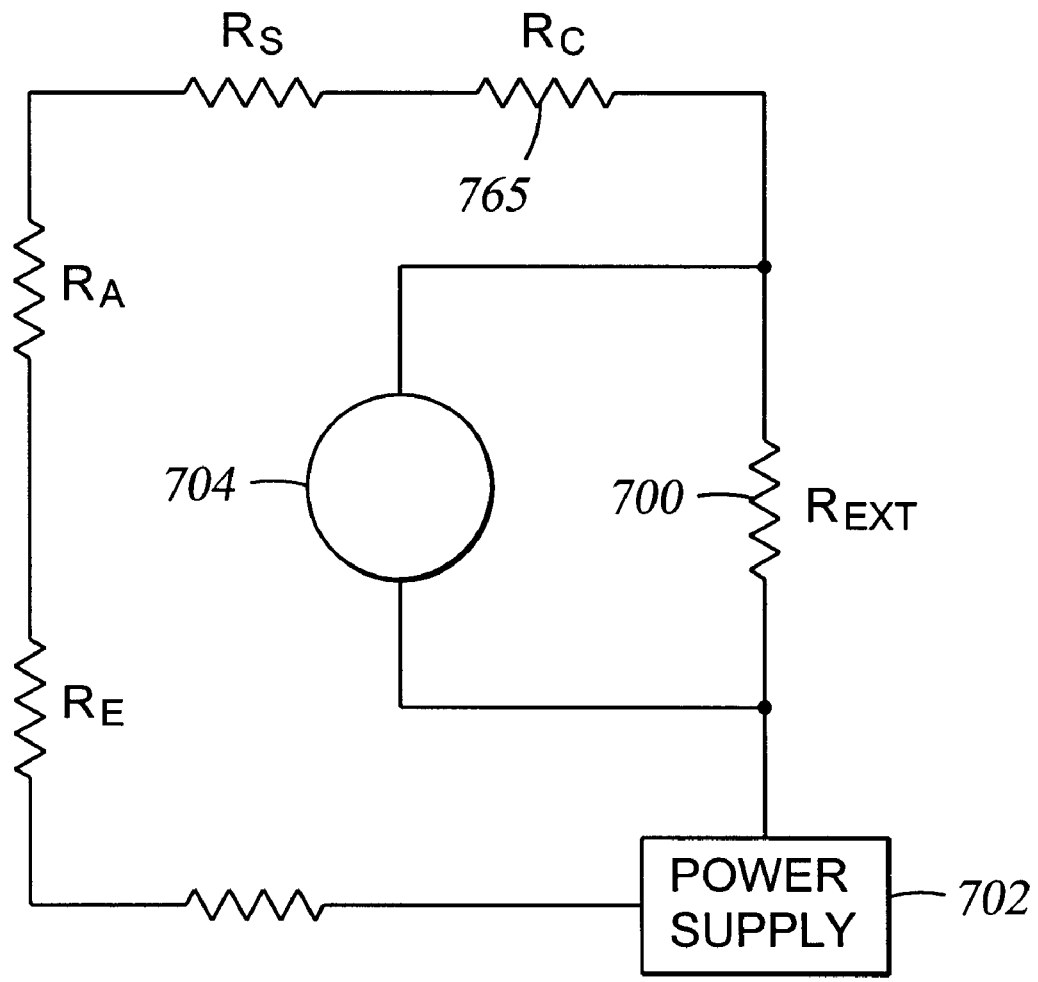
FIG. 11 is a simplified schematic diagram of the electrical circuit representing the electroplating system through each contact pin.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700 (represented as $R_{EXT}$) is much greater than the resistance of any other component of the circuit. As shown in FIG. 11, the electrical circuit through each conducting member 765 is represented by the resistance of each of the components connected in series with the power supply 702. $R_E$ represents the resistance of the electrolyte, which is typically dependent on the distance between the anode and the cathode contact ring and the composition of the electrolyte chemistry. Thus, $R_A$ represents the resistance of the electrolyte adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor ($R_{EXT}$) is at least as much as $\Sigma R$ (where $\Sigma R$ equals the sum of $R_E$, $R_A$, $R_S$ and $R_C$). Preferably, the resistance value of the external resistor ($R_{EXT}$) is much greater than $\Sigma R$ such that $\Sigma R$ is negligible and the resistance of each series circuit approximates $R_{EXT}$.

Typically, one power supply is connected to all of the outer contact pads 780 of the cathode contact ring 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electrical current passed through each conducting member 765 becomes controlled mainly by the value of the external resistor. As a result, the variations in the electrical properties between each of the inner contact pads 772 do not affect the current distribution on the substrate, and a uniform current density results across the plating surface which contributes to a uniform plating thickness. The external resistors also provide a uniform current distribution between different substrates of a process-sequence.

Although the contact ring 466 of the present invention is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

Figure 12:
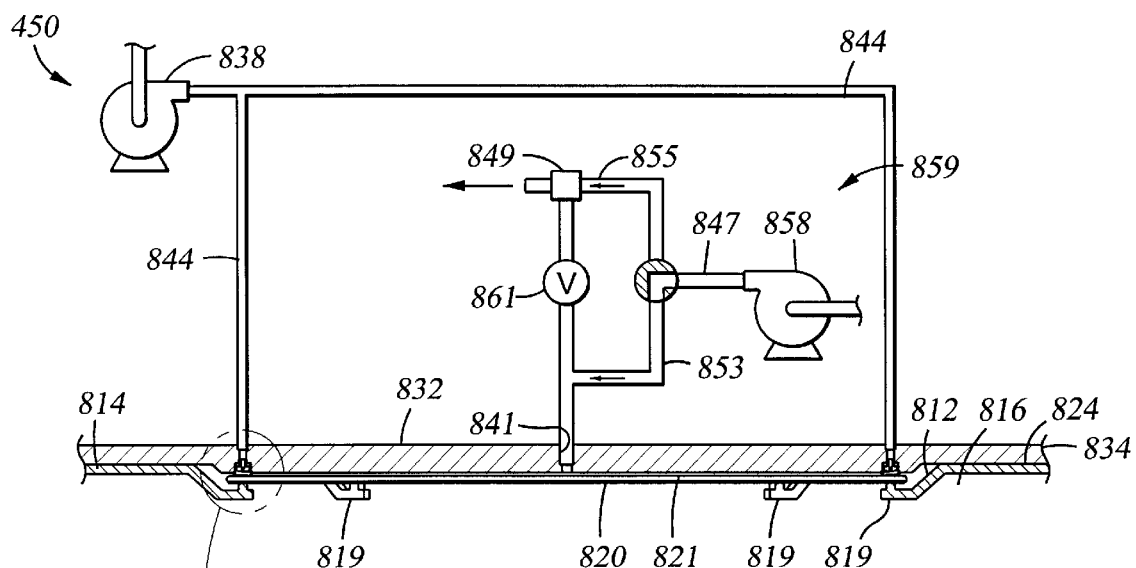
FIG. 12 is a cross sectional view of a wafer assembly 450 of the invention.
Figure 12A:
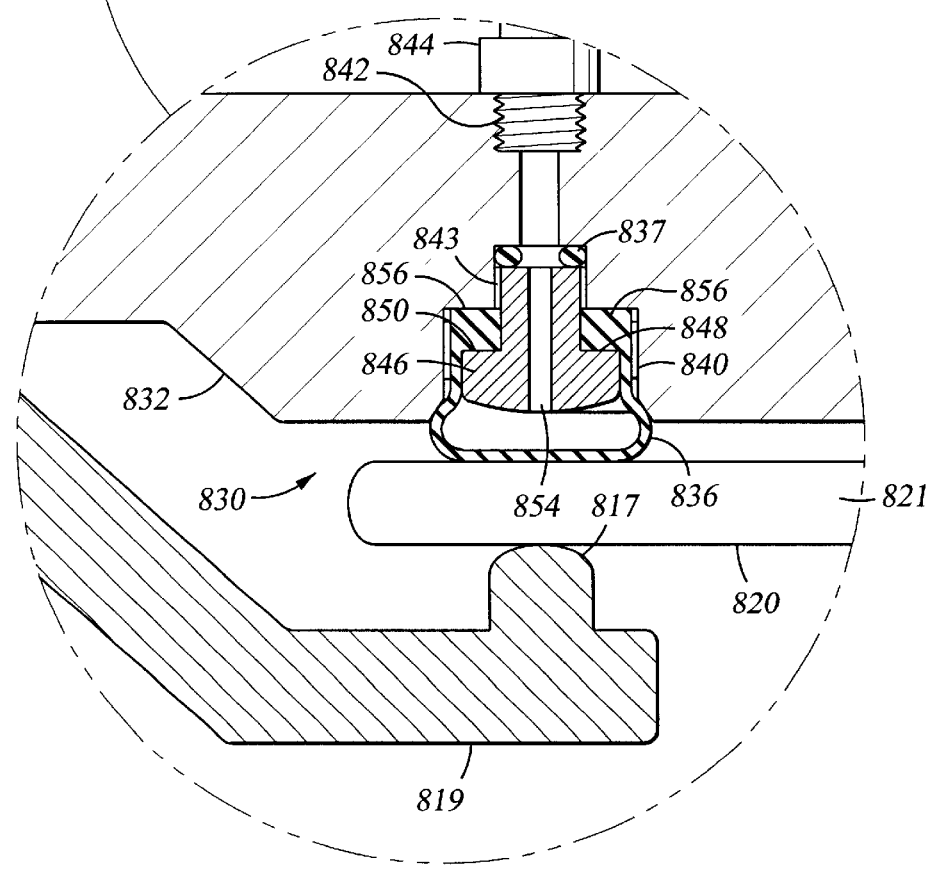
FIG. 12A is an enlarged cross sectional view of the bladder area of FIG. 12.

Referring to FIGS. 12 and 12A, the wafer holder 464 is preferably positioned above the cathode contact ring 466 and comprises a bladder assembly 470 that provides pressure to the backside of a wafer and ensures electrical contact between the wafer plating surface and the cathode contact ring 466. The inflatable bladder assembly 470 is disposed on a wafer holder plate 832. A bladder 836 disposed on a lower surface of the wafer holder plate 832 is thus located opposite and adjacent to the contacts on the cathode contact ring 466 with the substrate 821 interposed therebetween. A fluid source 838 supplies a fluid, i.e., a gas or liquid, to the bladder 836 allowing the bladder 836 to be inflated to varying degrees.

Figure 13:
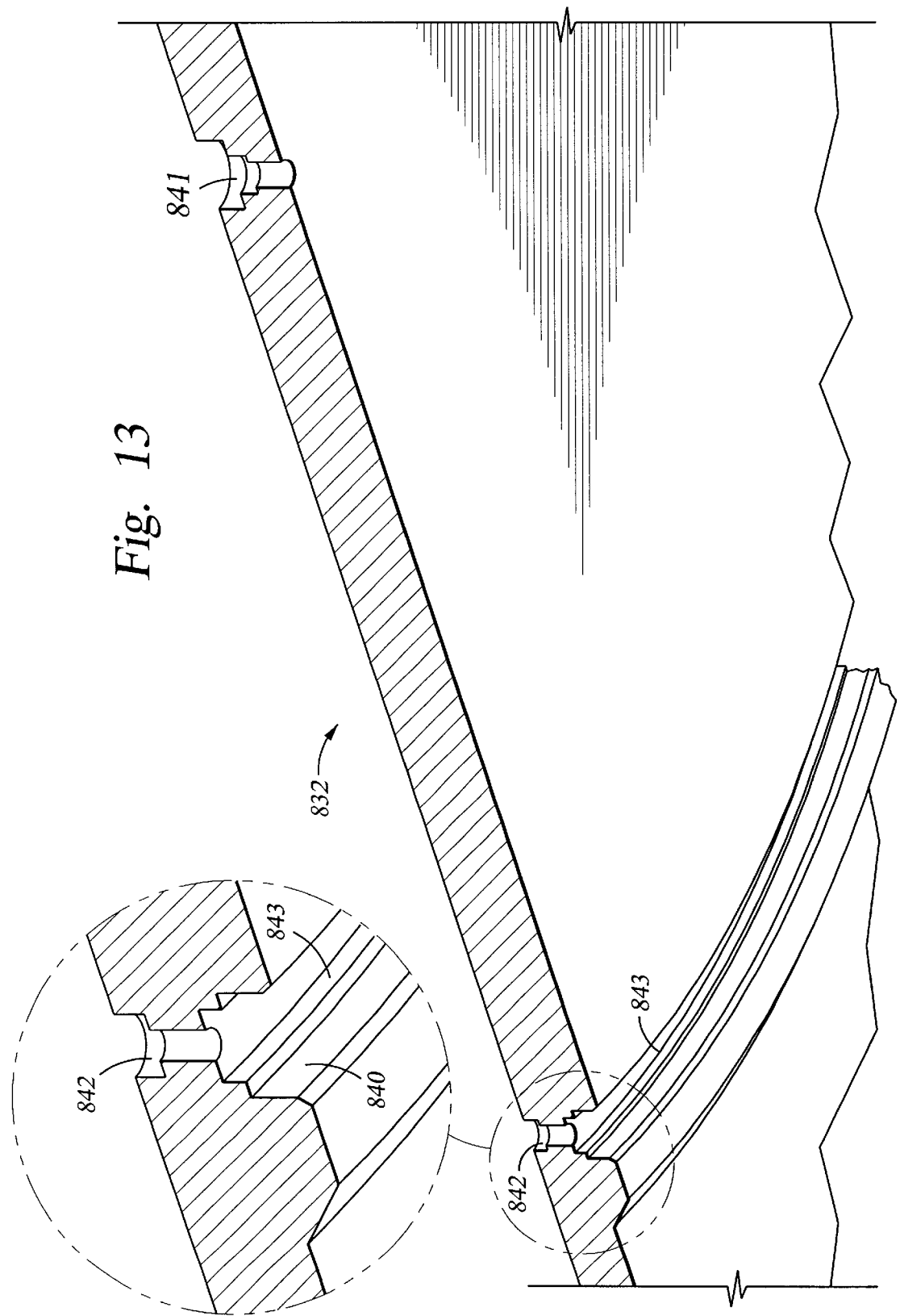
FIG. 13 is a partial cross sectional view of a wafer holder plate.

Referring now to FIGS. 12, 12A, and 13, the details of the bladder assembly 470 will be discussed. The wafer holder plate 832 is shown as substantially disc-shaped having an annular recess 840 formed on a lower surface and a centrally disposed vacuum port 841. One or more inlets 842 are formed in the wafer holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849 (commonly known as a venturi). One vacuum ejector that may be used to advantage in the present invention is available from SMC Pneumatics, Inc., of Indianapolis, Indiana. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Persons skilled in the art will readily appreciate other arrangements which do not depart from the spirit and scope of the present invention. For example, where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
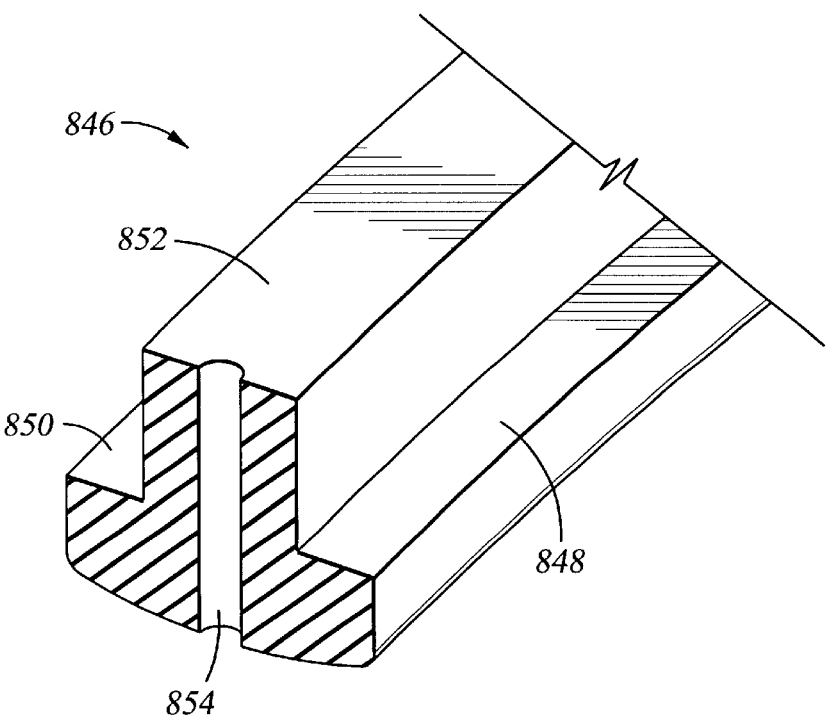
FIG. 14 is a partial cross sectional view of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the wafer holder plate 832 to ensure an airtight seal. Conventional fasteners (not shown) such as screws may be used to secure the manifold 846 to the wafer holder plate 832 via cooperating threaded bores (not shown) formed in the manifold 846 and the wafer holder plate 832.

Figure 15:
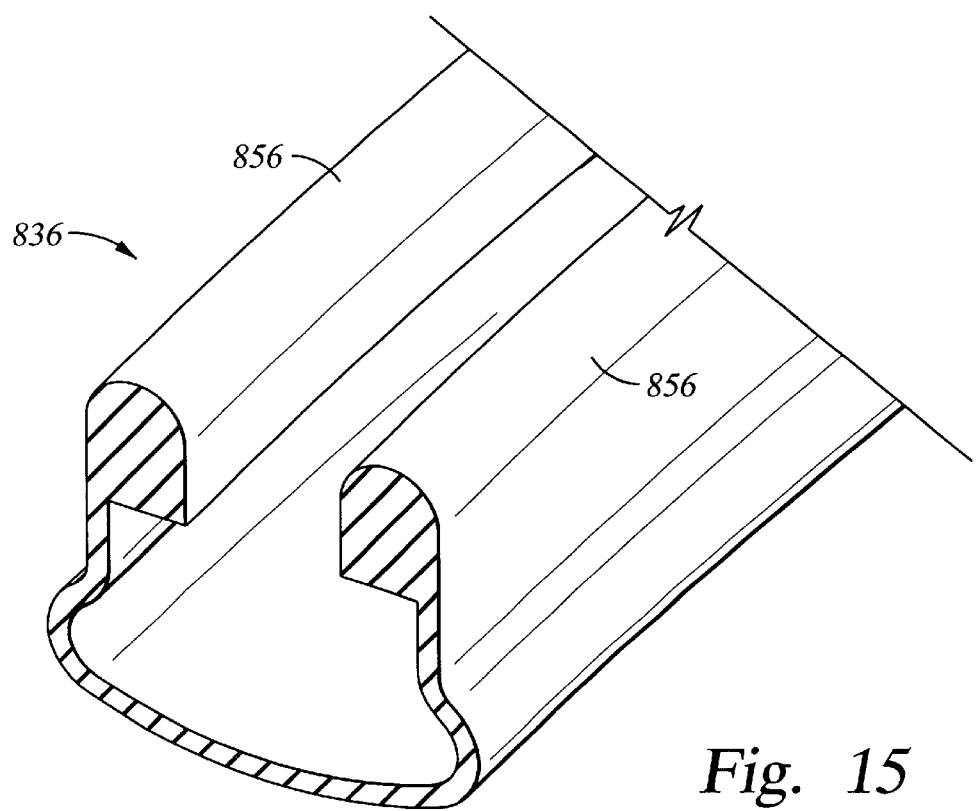
FIG. 15 is a partial cross sectional view of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less (e.g. a few millimeters) than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte and exhibits reliable elasticity. Where needed a compliant covering 857 may be disposed over the bladder 836, as shown in FIG. 15, and secured by means of an adhesive or thermal bonding. The covering 857 preferably comprises an elastomer such as Viton™, buna rubber or the like, which may be reinforced by Kevlar™, for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture.

The precise number of inlets 842 and outlets 854 may be varied according to the particular application without deviating from the present invention. For example, while FIG. 12 shows two inlets with corresponding outlets, an alternative embodiment could employ a single fluid inlet which supplies fluid to the bladder 836.

In operation, the substrate 821 is introduced into the container body 802 by securing it to the lower side of the wafer holder plate 832. This is accomplished by engaging the pumping system 159 to evacuate the space between the substrate 821 and the wafer holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the cathode contact ring 466. The electroplating process is then carried out. An electrolyte is then pumped into the process kit 420 toward the substrate 821 to contact the exposed substrate plating surface 820. The power supply provides a negative bias to the substrate plating surface 820 via the cathode contact ring 466. As the electrolyte is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the cathode contact ring 466 thereby mitigating misalignment with the conducting cathode contact ring 466. The compliant bladder 836 prevents the electrolyte from contaminating the backside of the substrate 821 by establishing a fluid tight seal at a perimeter portion of a backside of the substrate 821. Once inflated, a uniform pressure is delivered downward toward the cathode contact ring 466 to achieve substantially equal force at all points where the substrate 821 and cathode contact ring 466 interface. The force can be varied as a function of the pressure supplied by the fluid source 838. Further, the effectiveness of the bladder assembly 470 is not dependent on the configuration of the cathode contact ring 466. For example, while FIG. 12 shows a pin configuration having a plurality of discrete contact points, the cathode contact ring 466 may also be a continuous surface.

Because the force delivered to the substrate 821 by the bladder 836 is variable, adjustments can be made to the current flow supplied by the contact ring 466. As described above, an oxide layer may form on the cathode contact ring 466 and act to restrict current flow. However, increasing the pressure of the bladder 836 may counteract the current flow restriction due to oxidation. As the pressure is increased, the malleable oxide layer is compromised and superior contact between the cathode contact ring 466 and the substrate 821 results. The effectiveness of the bladder 836 in this capacity may be further improved by altering the geometry of the cathode contact ring 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 240 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an OFF position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may, however, be desirable to provide a backside pressure to the substrate 820 in order to cause a "bowing" effect of the substrate to be processed. The inventors of the present invention have discovered that bowing results in superior deposition. Thus, pumping system 859 is capable of selectively providing a vacuum or pressure condition to the substrate backside. For a 200 mm wafer a backside pressure up to 5 psi is preferable to bow the substrate. Because substrates typically exhibit some measure of pliability, a backside pressure causes the substrate to bow or assume a convex shape relative to the upward flow of the electrolyte. The degree of bowing is variable according to the pressure supplied by pumping system 859.

Those skilled in the art will readily recognize other embodiments which are contemplated by the present invention. For example, while FIG. 12A shows a preferred bladder 836 having a surface area sufficient to cover a relatively small perimeter portion of the substrate backside at a diameter substantially equal to the cathode contact ring 466, the bladder assembly 470 may be geometrically varied. Thus, the bladder assembly may be constructed using more fluid impervious material to cover an increased surface area of the substrate 821.

Referring back to FIG. 6, a cross sectional view of an electroplating process cell 240, the wafer holder assembly 450 is positioned above the process kit 420. The process kit 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, plexiglass (acrylic), lexane, PVC, CPVC, and PVDF. Alternatively, the container body 472 can be made from a metal, such as stainless steel, nickel and titanium, which is coated with an insulating layer, such as teflon, PVDF, plastic, rubber and other combinations of materials that do not dissolve in the electrolyte and can be electrically insulated from the electrodes (i.e., the anode and cathode of the electroplating system). The container body 472 is preferably sized and adapted to conform to the wafer plating surface and the shape of the of a wafer being processed through the system, typically circular or rectangular in shape. One preferred embodiment of the container body 472 comprises a cylindrical ceramic tube having an inner diameter that has about the same dimension as or slightly larger than the wafer diameter. The inventors have discovered that the rotational movement typically required in typical electroplating systems is not required to achieve uniform plating results when the size of the container body conforms to about the size of the wafer plating surface.

An upper portion of the container body 472 extends radially outwardly to form an annular weir 478. The weir 478 extends over the inner wall 446 of the electrolyte collector 440 and allows the electrolyte to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a wafer is positioned in the processing position, the wafer plating surface is positioned above the cylindrical opening of the container body 472, and a gap for electrolyte flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte into the electrolyte collector 440.

A lower portion of the container body 472 extends radially outwardly to form a lower annular flange 486 for securing the container body 472 to the bowl 430. The outer dimension (i.e., circumference) of the annular flange 486 is smaller than the dimensions of the opening 444 and the inner circumference of the electrolyte collector 440 to allow removal and replacement of the process kit 420 from the electroplating process cell 240. Preferably, a plurality of bolts 488 are fixedly disposed on the annular flange 486 and extend downwardly through matching bolt holes on the bowl 430. A plurality of removable fastener nuts 490 secure the process kit 420 onto the bowl 430. A seal 487, such as an elastomer O-ring, is disposed between container body 472 and the bowl 430 radially inwardly from the bolts 488 to prevent leaks from the process kit 420. The nuts/bolts combination facilitates fast and easy removal and replacement of the components of the process kit 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte. Alternatively, the anode assembly 474 comprises a non-consumable anode, and the metal to be electroplated is supplied within the electrolyte from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electrochemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable (i.e., soluble) anode provides gas-generation-free electrolyte and minimizes the need to constantly replenish the metal in the electrolyte.

An anode electrode contact 498 is inserted into the anode enclosure 494 to provide electrical connection to the soluble metal 496 from a power supply. Preferably, the anode electrode contact 498 is made from a conductive material that is insoluble in the electrolyte, such as titanium, platinum and platinum-coated stainless steel. The anode electrode contact 498 extends through the bowl 430 and is connected to an electrical power supply. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process kit 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension (i.e., circumference) of the upper annular flange 506 is about the same as the outer dimension (i.e., circumference) of the lower annular flange 486.Preferably, the lower surface of the upper annular flange 506 of the bowl 430 rests on a support flange of the mainframe 214 when the process kit 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process kit 420. When the process kit 420 needs maintenance, the electrolyte is drained from the process kit 420, and the electrolyte flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process kit 420. The process kit 420 is then removed from the mainframe 214, and a new or reconditioned process kit is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 16:
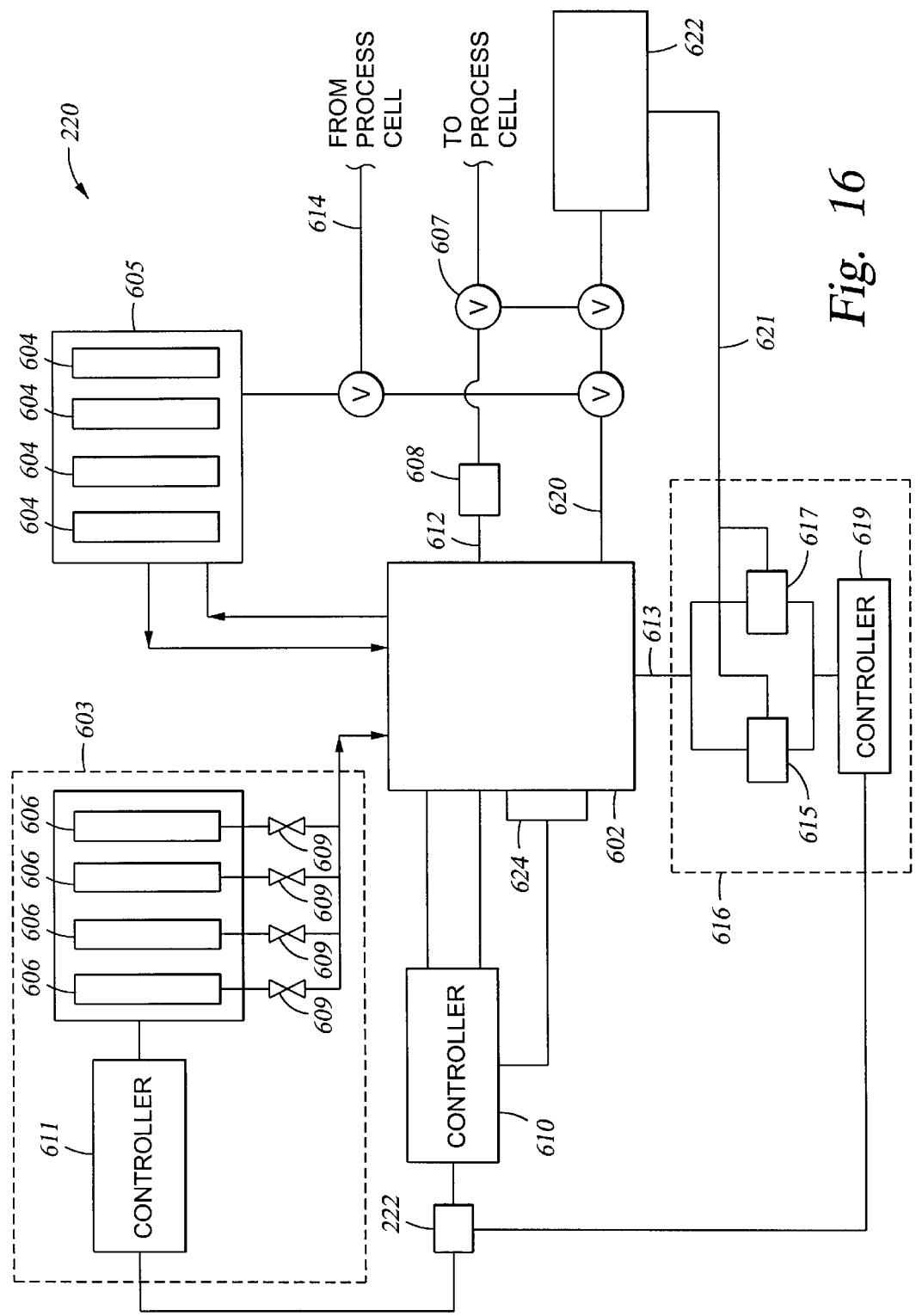
FIG. 16 is a schematic diagram of an electrolyte replenishing system 220.

FIG. 16 is a schematic diagram of an electrolyte replenishing system 220. The electrolyte replenishing system 220 provides the electrolyte to the electroplating process cells for the electroplating process. The electrolyte replenishing system 220 generally comprises a main electrolyte tank 602, a dosing module 603, a filtration module 605, a chemical analyzer module 616, and an electrolyte waste disposal system 622 connected to the analyzing module 6161 by an electrolyte waste drain 620. One or more controllers control the composition of the electrolyte in the main tank 602 and the operation of the electrolyte replenishing system 220. Preferably, the controllers are independently operable but integrated with the control system 222 of the electroplating system platform 200.

The main electrolyte tank 602 provides a reservoir for electrolyte and includes an electrolyte supply line 612 that is connected to each of the electroplating process cells through one or more fluid pumps 608 and valves 607. A heat exchanger 624 or a heater/chiller disposed in thermal connection with the main tank 602 controls the temperature of the electrolyte stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte and typically include a deionized water source tank and copper sulfate ($CuSO_4$) source tank for composing the electrolyte. Other source tanks 606 may contain hydrogen sulfate ($H_2SO_4$), hydrogen chloride (HCl) and various additives such as glycol. The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the system control 222 to receive signals therefrom.

The electrolyte filtration module 605 includes a plurality of filter tanks 604. An electrolyte return line 614 is connected between each of the process cells and one or more filter tanks 604. The filter tanks 604 remove the undesired contents in the used electrolyte before returning the electrolyte to the main tank 602 for re-use. The main tank 602 is also connected to the filter tanks 604 to facilitate re-circulation and filtration of the electrolyte in the main tank 602. By re-circulating the electrolyte from the main tank 602 through the filter tanks 604, the undesired contents in the electrolyte are continuously removed by the filter tanks 604 to maintain a consistent level of purity. Additionally, re-circulating the electrolyte between the main tank 602 and the filtration module 605 allows the various chemicals in the electrolyte to be thoroughly mixed.

The electrolyte replenishing system 220 also includes a chemical analyzer module 616 that provides real-time chemical analysis of the chemical composition of the electrolyte. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte and by-products resulting from the processing which are returned to the main tank 602 from the process cells.

The analyzer module shown FIG. 16 is merely illustrative. In another embodiment each analyzer may be coupled to the main electrolyte tank by a separate supply line and be operated by separate controllers. Persons skilled in the art will recognize other embodiments.

In operation, a sample of electrolyte is flowed to the analyzer module 616 via the sample line 613. Although the sample may be taken periodically, preferably a continuous flow of electrolyte is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the control system 222. The control system 222 processes the information and transmits signals which include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte throughout the electroplating process. The waste electrolyte from the analyzer module is then flowed to the waste disposal system 622 via the outlet line 621.

Although a preferred embodiment utilizes real-time monitoring and adjustments of the electrolyte, various alternatives may be employed according to the present invention. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte replenishing system 220 also includes an electrolyte waste drain 620 connected to an electrolyte waste disposal system 622 for safe disposal of used electrolytes, chemicals and other fluids used in the electroplating system. Preferably, the electroplating cells include a direct line connection to the electrolyte waste drain 620 or the electrolyte waste disposal system 622 to drain the electroplating cells without returning the electrolyte through the electrolyte replenishing system 220. The electrolyte replenishing system 220 preferably also includes a bleed off connection to bleed off excess electrolyte to the electrolyte waste drain 620.

Although not shown in FIG. 16, the electrolyte replenishing system 220 may include a number of other components. For example, the electrolyte replenishing system 220 preferably also includes one or more additional tanks for storage of chemicals for a wafer cleaning system, such as the SRD station. Double-contained piping for hazardous material connections may also be employed to provide safe transport of the chemicals throughout the system. Optionally, the electrolyte replenishing system 220 includes connections to additional or external electrolyte processing system to provide additional electrolyte supplies to the electroplating system.

Referring back to FIG. 2, the electroplating system platform 200 includes a control system 222 that controls the functions of each component of the platform. Preferably, the control system 222 is mounted above the mainframe 214 and comprises a programmable microprocessor. The programmable microprocessor is typically programmed using a software designed specifically for controlling all components of the electroplating system platform 200. The control system 222 also provides electrical power to the components of the system and includes a control panel 223 that allows an operator to monitor and operate the electroplating system platform 200. The control panel 223, as shown in FIG. 2, is a stand-alone module that is connected to the control system 222 through a cable and provides easy access to an operator. Generally, the control system 222 coordinates the operations of the loading station 210, the SRD station 212, the mainframe 214 and the processing stations 218. Additionally, the control system 222 coordinates with the controller of the electrolyte replenishing system 220 to provide the electrolyte for the electroplating process.

The following is a description of a typical wafer electroplating process sequence through the electroplating system platform 200 as shown in FIG. 2. A wafer cassette containing a plurality of wafers is loaded into the wafer cassette receiving areas 224 in the loading station 210 of the electroplating system platform 200. A loading station transfer robot 228 picks up a wafer from a wafer slot in the wafer cassette and places the wafer in the wafer orientor 230. The wafer orientor 230 determines and orients the wafer to a desired orientation for processing through the system. The loading station transfer robot 228 then transfers the oriented wafer from the wafer orientor 230 and positions the wafer in one of the wafer slots in the wafer pass-through cassette 238 in the SRD station 212. The mainframe transfer robot 242 picks up the wafer from the wafer pass-through cassette 238 and positions the wafer for transfer by the flipper robot 248. The flipper robot 248 rotates its robot blade below the wafer and picks up wafer from mainframe transfer robot blade. The vacuum suction gripper on the flipper robot blade secures the wafer on the flipper robot blade, and the flipper robot flips the wafer from a face up position to a face down position. The flipper robot 248 rotates and positions the wafer face down in the wafer holder assembly 450. The wafer is positioned below the wafer holder 464 but above the cathode contact ring 466. The flipper robot 248 then releases the wafer to position the wafer into the cathode contact ring 466. The wafer holder 464 moves toward the wafer and the vacuum chuck secures the wafer on the wafer holder 464. The bladder assembly 470 on the wafer holder assembly 450 exerts pressure against the wafer backside to ensure electrical contact between the wafer plating surface and the cathode contact ring 466.

The head assembly 452 is lowered to a processing position above the process kit 420. At this position the wafer is below the upper plane of the weir 478 and contacts the electrolyte contained in the process kit 420. The power supply is activated to supply electrical power (i.e., voltage and current) to the cathode and the anode to enable the electroplating process. The electrolyte is typically continually pumped into the process kit during the electroplating process. The electrical power supplied to the cathode and the anode and the flow of the electrolyte are controlled by the control system 222 to achieve the desired electroplating results. After the electroplating process is completed, the head assembly 410 raises the wafer holder assembly and removes the wafer from the electrolyte. The vacuum chuck and the bladder assembly of the wafer holder release the wafer from the wafer holder, and the wafer holder is raised to allow the flipper robot blade to pick up the processed wafer from the cathode contact ring. The flipper robot rotates the flipper robot blade above the backside of the processed wafer in the cathode contact ring and picks up the wafer using the vacuum suction gripper on the flipper robot blade. The flipper robot rotates the flipper robot blade with the wafer out of the wafer holder assembly, flips the wafer from a face-down position to a face-up position, and positions the wafer on the mainframe transfer robot blade. The mainframe transfer robot then transfers and positions the processed wafer above the SRD module 236. The SRD wafer support lifts the wafer, and the mainframe transfer robot blade retracts away from the SRD module 236. The wafer is cleaned in the SRD module using deionized water or a combination of deionized water and a cleaning fluid as described in detail above. The wafer is then positioned for transfer out of the SRD module. The loading station transfer robot 228 picks up the wafer from the SRD module 236 and transfers the processed wafer into the wafer cassette for removal from the electroplating system. The above-described sequence can be carried out for a plurality of wafers simultaneously in the electroplating system platform 200 of the present invention. While the foregoing is directed to the preferred embodiment of the present invention, other and further embodiments of the invention may be devised without departing from the basic scope thereof. The scope of the invention is determined by the claims which follow.

What is claimed is:

1. An electro-chemical deposition system, comprising:
 a) an electrolyte supply tank in fluid communication with one or more electro-chemical process cells; and
 b) a chemical analyzer module comprising one or more chemical analyzers in communication with the electrolyte supply tank, wherein the one or more chemical analyzers comprise an organic chemical analyzer and an inorganic chemical analyzer.

2. The system of claim 1, wherein the organic chemical analyzer comprises a cyclic voltametric stripper.

3. The system of claim 1, wherein the inorganic chemical analyzer comprises an auto titration analyzer.

4. An electro-chemical deposition system, comprising:
 a) a mainframe comprising, one or more electro-chemical process cells; and
 b) an electrolyte replenishing system disposed in connection with the mainframe, comprising:
  (i) an electrolyte supply tank;
  (ii) a chemical analyzer module comprising one or more chemical analyzers in communication with the electrolyte supply tank;
  (iii) a chemical supply module in communication with the electrolyte supply tank; and
  (iv) one or more controllers to operate the electrolyte replenishing system;
 c) a spiln -rinse-dry station desposed in connection with the mainframe; and
 d) a loading station desposed in connection with the spin-rinse-dry station.

5. An electro-chemical deposition system, comprising:
 a) a mainframe comprising, one or more electrochemical process cells; and
 b) an electrolyte replenishing system disposed in connection with the mainframe, comprising:
  (i) an electrolyte supply tank;
  (ii) a chemical analyzer module comprising one or more chemical analyzers in communication with the electrolyte supply tank, wherein the one or more chemical analyzers comprise an organic chemical analyzer and an inorganic chemical analyzer;
  (iii) a chemical supply module in communication with the electrolyte supply tank; and
  (iv) one or more controllers to operate the electrolyte replenishing system.

6. The system of claim 5, wherein the organic chemical analyzer comprises a cyclic voltametric stripper.

7. The system of claim 5, wherein the inorganic chemical analyzer comprises an auto titration analyzer.

8. A method for analyzing an electrolyte in a electro-chemical deposition system comprising one or more process cells in communication with a main electrolyte supply tank, comprising:
 a) flowing at least a portion of the electrolyte from the main electrolyte supply tank to one or more chemical analyzers; and
 b) analyzing the electrolyte to determine the concentrations of inorganic substances and organic substances, wherein analyzing the electrolyte comprises operating a auto titration analyzer and a cyclic voltametric stripper.

9. A signal-bearing medium containing a program that, when executed by a processor, causes one or more controllers to perform the steps of:
(a) flowing at least a portion of electrolyte from an electrolyte supply tank to one or more chemical analyzers; and
(b) generating data regarding the composition of the electrolyte by operating an auto-titration analyzer and a cyclic voltametric stripper.

10. A signal-bearing medium containing a program that, when executed by a processor, causes one or more controllers to perform the steps of:
(a) flowing at least a portion of electrolyte from an electrolyte supply tank to one or more chemical analyzers; and
(b) generating data regarding the composition of the electrolyte to determine concentrations of inorganic substances and organic substances.

11. A signal-bearing medium containing a program that, when executed by a processor, causes one or more controllers to perform the steps of:
(a) flowing at least a portion of electrolyte from an electrolyte supply tank to one or more chemical analyzers;
(b) generating data regarding the composition of the electrolyte to determine concentrations of inorganic substances and organic substances; and
(c) flowing one or more chemicals from one or more source tanks to the electrolyte supply tank in proportions based on the data generated in step (b).

12. The signal-bearing medium of claim 11, wherein step (b) comprises operating an auto-titration analyzer and a cyclic voltametric stripper.

13. An electro-chemical deposition system, comprising:
a) an electrolyte supply tank in fluid communication with one or more electro-chemical process cells;
b) a chemical analyzer module comprising one or more chemical analyzers in communication with the electrolyte supply tank, wherein the one or more chemical analyzers comprise an organic chemical analyzer and an inorganic chemical analyzer; and
c) a controller coupled to the one or more chemical analyzers.

14. An electro-chemical deposition system, comprising:
a) an electrolyte supply tank in fluid communication with one or more electro-chemical process cells;
b) a chemical analyzer module comprising one or more chemical analyzers in communication with the electrolyte supply tank, wherein the one or more chemical analyzers comprise an organic chemical analyzer and an inorganic chemical analyzer; and
c) a filtration module includeng one or more filters coupled to the electrolyte supply tank.

* * * * *

UNITED STATES PATENT AND TRADEMARK OFFICE
CERTIFICATE OF CORRECTION

PATENT NO. : 6,254,760 B1
DATED : July 3, 2001
INVENTOR(S) : Ben Shen, Yezdi Dordi and George Birkmaier It is certified that error appears in the above-identified patent and that said Letters Patent is hereby corrected as shown below:

Column 10,
Line 39, please replace "180" with -- 780 --.
Line 52, please replace "SO" with -- so --.

Column 22,
Line 32, please replace "spiln" with -- spin --.
Line 32, please replace "desposed" with -- disposed --.
Line 34, please replace "desposed" with -- disposed --.

Signed and Sealed this

Ninth Day of April, 2002

Attest:

JAMES E. ROGAN
Attesting Officer
Director of the United States Patent and Trademark Office